United States Patent
Chen et al.

(10) Patent No.: US 10,439,793 B2
(45) Date of Patent: Oct. 8, 2019

(54) DEVICE AND METHOD FOR RECOVERING CLOCK AND DATA

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Yen-Chung Chen, Hsinchu (TW); Wen-Juh Kang, Hsinchu (TW); Cheng-Hung Wu, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/585,164

(22) Filed: May 3, 2017

(65) Prior Publication Data

US 2018/0323956 A1    Nov. 8, 2018

(51) Int. Cl.
*H04L 7/033*     (2006.01)
*H03L 7/08*      (2006.01)
*H03L 7/093*     (2006.01)
*H04L 7/00*      (2006.01)

(52) U.S. Cl.
CPC .......... *H04L 7/0331* (2013.01); *H03L 7/0807* (2013.01); *H03L 7/093* (2013.01); *H04L 7/0025* (2013.01); *H04L 7/0337* (2013.01)

(58) Field of Classification Search
CPC ..... H04L 7/033; H04L 7/0016; H04L 7/0083; H04L 25/00; H03L 7/10; H03L 7/0812; H03L 7/091
See application file for complete search history.

(56) References Cited

U.S. PATENT DOCUMENTS

| | | | | |
|---|---|---|---|---|
| 5,068,626 A * | 11/1991 | Takagi | ................... | H03L 7/0895 331/17 |
| 6,560,053 B1 * | 5/2003 | Ohta | ................ | G11B 20/10009 360/26 |
| 9,264,219 B1 * | 2/2016 | Kang | ..................... | H03L 7/091 |
| 2002/0089356 A1 * | 7/2002 | Perrott | .................... | H03L 7/085 327/105 |
| 2008/0267336 A1 * | 10/2008 | Okamoto | ............... | H03D 3/009 375/376 |
| 2009/0003501 A1 * | 1/2009 | Steinbach | ............... | H03L 7/085 375/376 |

* cited by examiner

*Primary Examiner* — Sam K Ahn
*Assistant Examiner* — Amneet Singh
(74) *Attorney, Agent, or Firm* — CKC & Partners Co. LLC

(57) ABSTRACT

A clock and data recovery device includes a data analysis circuit, a loop filter circuit, and a phase adjust circuit. The data analysis circuit is configured to generate an error signal according to input data, a first clock signal, and a second clock signal. The loop filter circuit is configured to generate an adjust signal according to the error signal. A phase filter circuit is configured to generate a first control signal according to the error signal. A switching element of a first frequency filter circuit is configured to output a second control signal according to the error signal and a first switching signal that has a first period. A first adder is configured to generate the adjust signal according to the first control signal and the second control signal. The phase adjust circuit is configured to adjust the first clock signal and the second clock signal.

19 Claims, 5 Drawing Sheets

DEVICE AND METHOD FOR RECOVERING CLOCK AND DATA

BACKGROUND

Technical Field

The present disclosure relates to a clock and data recovery technology. More particularly, the present disclosure relates to a clock and data recovery device and a clock and data recovery method.

Description of Related Art

With the rapid development of integrated circuit (IC) technology, operating speeds of integrated circuits have been significantly increased. When the operating speeds of integrated circuits increase, the probability of generating errors between data transmitted by a transmitter and data received by a receiver increases. A clock and data recovery (CDR) device is commonly utilized to assure that data may be correctly received by the receiver.

In addition, a spread spectrum technology is applied in data transmission, so as to prevent the transmitted data from interfering with other electronic devices. However, this may introduce more errors or jitters to data.

SUMMARY

One embodiment of the present disclosure is related to a clock and data recovery device. The clock and data recovery device includes a data analysis circuit, a loop filter circuit, and a phase adjust circuit. The data analysis circuit is configured to generate an error signal according to input data, a first clock signal, and a second clock signal. The loop filter circuit is configured to generate an adjust signal according to the error signal. The loop filter circuit includes a phase filter circuit, a first frequency filter circuit, and a first adder. The phase filter circuit is configured to generate a first control signal according to the error signal. The first frequency filter circuit includes a switching element, and the switching element is configured to output a second control signal according to the error signal and a first switching signal. The first switching signal has a first period. The first adder is configured to generate the adjust signal according to the first control signal and the second control signal. The phase adjust circuit is configured to adjust the first clock signal and the second clock signal according to the adjust signal.

Another embodiment of the present disclosure is related to a clock and data recovery method. The clock and data recovery method includes: generating an error signal, by a data analysis circuit, according to an input data, a first clock signal, and a second clock signal; generating a first control signal, by a phase filter circuit, according to the error signal; outputting a second control signal, by a switching element of a first frequency filter circuit, according to the error signal and a first switching signal that has a first period; generating an adjust signal, by a first adder, according to the first control signal and the second control signal; and adjusting the first clock signal and the second clock signal, by a phase adjust circuit, according to the adjust signal.

As the above embodiments, the clock and data recovery device and the clock and data recovery method of this disclosure reduce dynamic frequency offsets (for example, SSC offsets) of data, so as to reduce jitters of signals.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
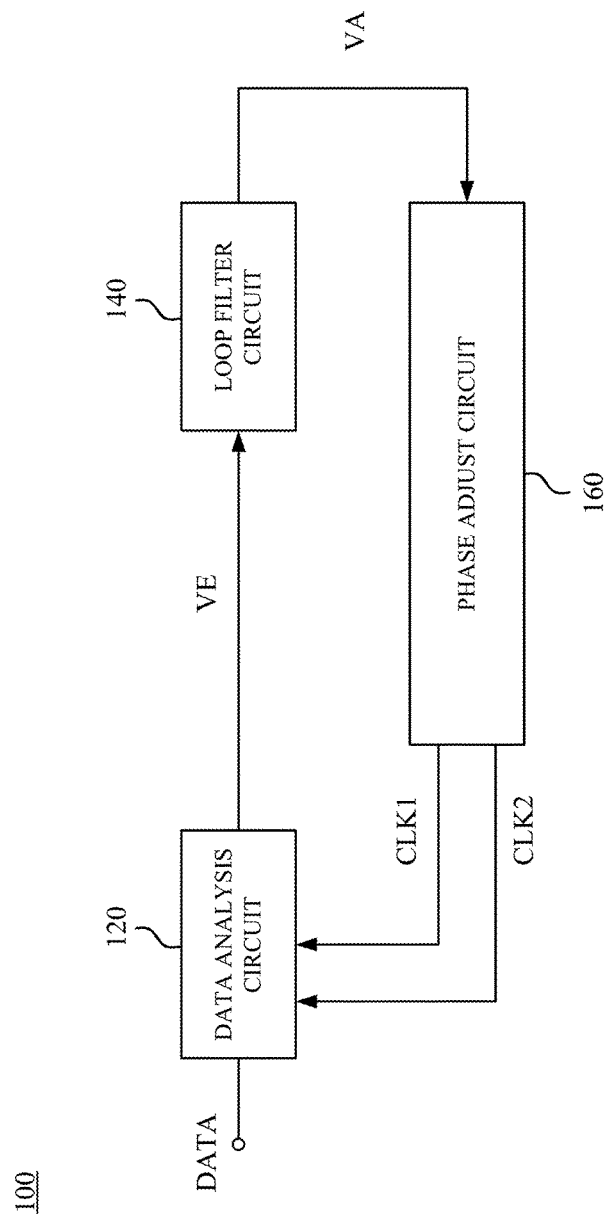
FIG. 1 is a schematic diagram illustrating a clock and data recovery device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

Moreover, the drawings are for the purpose of illustration only, and are not in accordance with the size of the original drawing. The components in description are described with the same number to understand.

Unless otherwise defined, all terms used in this specification and claims generally have their ordinary meaning in the art, within the context of the disclosure, and in the specific context where each term is used. Certain terms that are used to describe the disclosure are discussed below, or elsewhere in the specification, to provide additional guidance to the practitioner regarding the description of the disclosure.

As used herein with respect to the "first", "second" . . . is not special order or pick the alleged meaning, but simply to distinguish the operation described in the same terms or elements of it.

As used herein, "coupled" may refer to two or more elements are in "direct" physical or electrical contact made, or "indirectly", as a mutual entity or electrical contact, and may also refer to two or more elements are operating or action.

Reference is now made to FIG. 1. FIG. 1 is a schematic diagram illustrating a clock and data recovery device 100 according to some embodiments of the present disclosure. In some embodiments, the clock and data recovery device 100 includes a data analysis circuit 120, a loop filter circuit 140, and a phase adjust circuit 160.

The data analysis circuit 120 is configured to receive input data DATA. In some embodiments, the input data DATA is data processed with a spread spectrum clock (SSC). The SSC is a clock modulated by a spread spectrum technique. For example, the clock is modulated by a triangle wave. The modulation frequency is, for example, 30-33 kHz. The modulation deviation is, for example, 5000 ppm. With the SSC, the electromagnetic interference (EMI) could be reduced.

The data analysis circuit 120 is configured to generate an error signal VE according to the input data DATA, a clock signal CLK1, and a clock signal CLK2. In some embodiments, the data analysis circuit 120 includes two samplers (not shown) and one phase detector (not shown). One of the two samplers is configured to sample the input data DATA according to the clock signal CLK1. The other one of the two samplers is configured to sample the input data DATA according to the clock signal CLK2. The phase detector is configured to compare values sampled from the two samplers, to generate the error signal VE. In some embodiments, the clock signal CLK1 and the clock signal CLK2 are different in phase by 90 degrees.

The configurations of the data analysis circuit 120 are given for illustrative purposes only. Various configurations of the data analysis circuit 120 are within the contemplated scope of the present disclosure.

The loop filter circuit 140 is configured to generate an adjust signal VA according to the error signal VE. The detailed configurations of the loop filter circuit 140 are described in following paragraphs with reference to FIGS. 2-4.

The phase adjust circuit 160 is configured to adjust the clock signal CLK1 and the clock signal CLK2 according to the adjust signal VA. In some embodiments, the phase adjust circuit 160 includes a phase interpolator (not shown) and a clock signal generator (not shown). The phase interpolator is electrically coupled to the loop filter circuit 140. The phase interpolator is configured to receive the adjust signal VA, and to generate a phase adjust signal (not shown). The clock signal generator is electrically coupled to and controlled by the phase interpolator. For example, the clock signal generator is configured to receive the phase adjust signal, and to dynamically adjust the clock signal CLK1 and the clock signal CLK2 according to the phase adjust signal. In some embodiments, the clock signal generator increases or reduces the clock cycle of both of the clock signal CLK1 and the clock signal CLK2.

The configurations of the phase adjust circuit 160 are given for illustrative purposes only. Various configurations of the phase adjust circuit 160 are within the contemplated scope of the present disclosure.

In some embodiments, a feedback mechanism is formed by the data analysis circuit 120, the loop filter circuit 140, and the phase adjust circuit 160. In various embodiments, with the feedback mechanism, the clock signal CLK1 and the clock signal CLK2 can be adjusted to reduce phase and frequency offsets present in the input data DATA, in order to reduce jitters of signals. The detailed operations regarding the feedback mechanism are discussed with reference to FIGS. 2-4 below.

The following paragraphs provide certain embodiments associated with the loop filter circuit 140. It is noted that the following embodiments are given for illustrative purposes only. Various circuits to implement the functions of the loop filter circuit 140 in the present disclosure are within the contemplated scope of the present disclosure.

Figure 2:
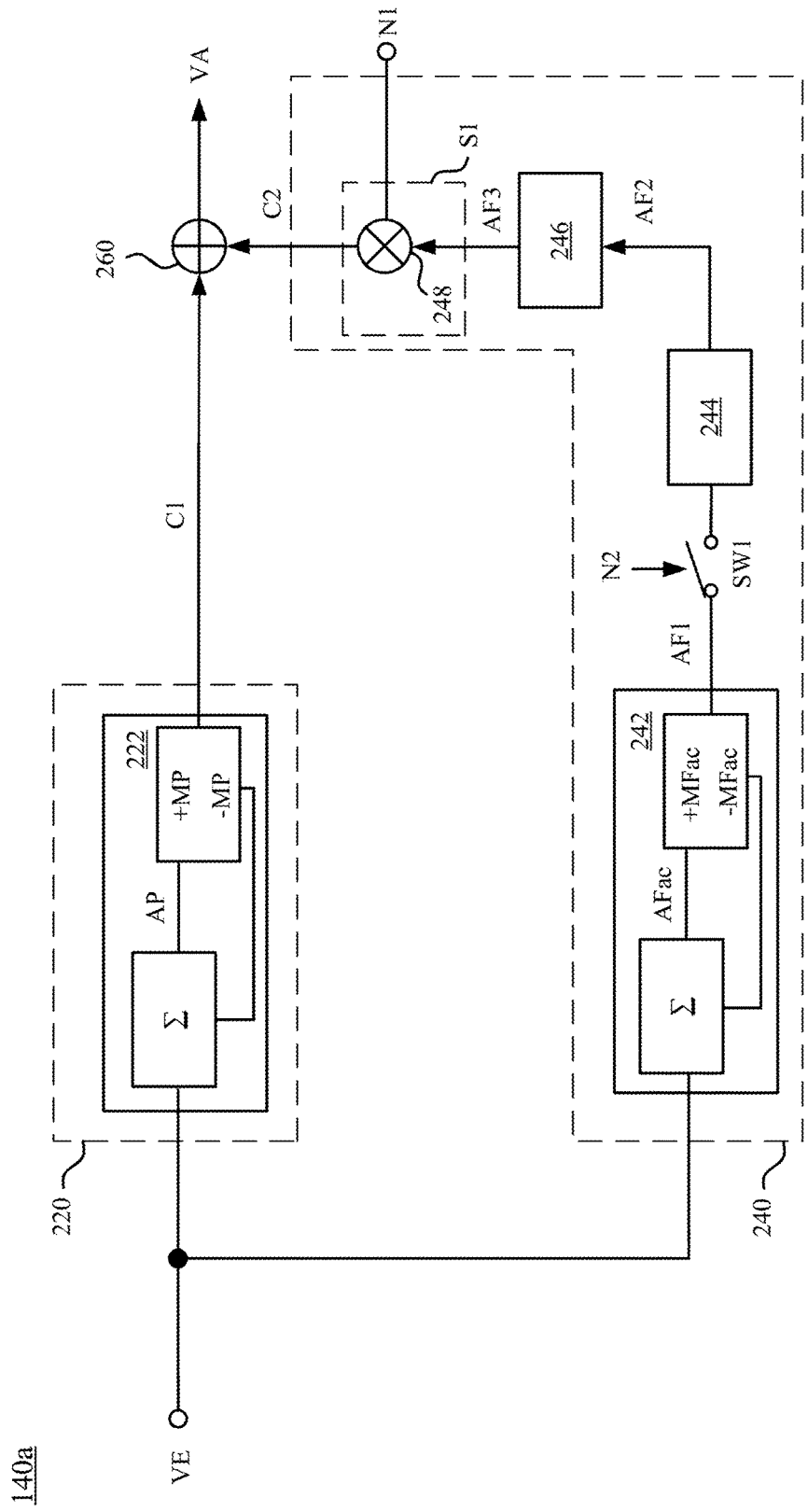
FIG. 2 is a circuit diagram illustrating a loop filter circuit in FIG. 1 according to some embodiments of this disclosure.

Reference is now made to FIG. 2. FIG. 2 is a circuit diagram illustrating a loop filter circuit 140a according to some embodiments of this disclosure. In some embodiments, the loop filter circuit 140a is configured to implement the loop filter circuit 140 in FIG. 1. For ease of understanding, with respect to the embodiments of FIG. 1, like elements in FIG. 2 are designated with the same reference numbers.

As illustratively shown in FIG. 2, the loop filter circuit 140a includes a phase filter circuit 220, a frequency filter circuit 240, and an adder 260.

The phase filter circuit 220 is configured to receive the error signal VE from the data analysis circuit 120 in FIG. 1, in order to generate a control signal C1.

In some embodiments, the phase filter circuit 220 includes a sigma delta modulator 222. The sigma delta modulator 222 is electrically coupled to the data analysis circuit 120 in FIG. 1, in order to receive the error signal VE. In some embodiments, the sigma delta modulator 222 includes an accumulator. The accumulator of the sigma delta modulator 222 is configured to accumulate the error signal VE to generate an accumulated value AP. The sigma delta modulator 222 is further configured to compare the accumulated value AP with a phase threshold value +MP or −MP. In some embodiments, the sigma delta modulator 222 compares the accumulated value AP with the phase threshold values +MP and −MP. When the accumulated value AP is larger than the phase threshold value +MP, the sigma delta modulator 222 outputs the control signal C1 with a logic value of +1. The accumulator is then reset by subtracting the phase threshold value +MP. When the accumulated value AP is smaller than the phase threshold value −MP, the sigma delta modulator 222 outputs the control signal C1 with a logic value of −1. The accumulator is then reset by subtracting the phase threshold value −MP. In other words, the sigma delta modulator 222 updates the control signal C1 on condition that the accumulated value AP is larger than the phase threshold value +MP or smaller than the phase threshold value −MP.

As described above, the sign of control signal C1 is corresponding to the sign of phase offsets of the input data DATA, while the frequency of the control signal C1 is corresponding to the magnitude of the phase offsets. Thus, with the arrangements of the phase filter circuit 220, the phase offsets of the input data DATA are able to be tracked.

The frequency filter circuit 240 is configured to receive the error signal VE from the data analysis circuit 120 in FIG. 1, and to output a control signal C2 according to the error signal VE and a switching signal N1.

In some embodiments, the frequency filter circuit 240 includes a sigma delta modulator 242, an integrator 244, a counter 246, and a switching element S1. In some embodiments, the switching element S1 is implemented with a multiplier 248, as shown in FIG. 2. In some embodiments, the frequency filter circuit 240 further includes a switch SW1.

In some embodiments, the switch SW1 is implemented with one and more transistors. Various types of the transistors, which are able to implement the switch SW1, are within the contemplated scope of the present disclosure. In some embodiments, the transistors may be bipolar junction transistors (BJTs), metal-oxide-silicon filed-effect transistors (MOSFETs), or insulated gate bipolar transistors (IGBTs).

The sigma delta modulator 242 is electrically coupled to the data analysis circuit 120 in FIG. 1, in order to receive the error signal VE. In some embodiments, the sigma delta modulator 242 includes an accumulator. The accumulator of the sigma delta modulator 242 is configured to accumulate the error signal VE to generate an accumulated value AFac in the frequency path. The sigma delta modulator 242 is further configured to compare the accumulated value AFac with a frequency threshold value +MFac or −MFac. In some embodiments, the sigma delta modulator 242 compares the accumulated value AFac with the frequency threshold values +MFac and −MFac. When the accumulated value AFac is larger than the frequency threshold value +MFac, the sigma delta modulator 242 outputs a modulation signal AF1 with the logic value of +1. The accumulator is then reset by subtracting the frequency threshold value +MFac. When the accumulated value AFac is smaller than the frequency threshold value −MFac, the sigma delta modulator 242 outputs the modulation signal AF1 with the logic value of −1. The accumulator is then reset by subtracting the frequency threshold value −MFac. In other words, the sigma delta modulator 242 updates the modulation signal AF1 on condition that the accumulated value AFac is larger than the frequency threshold value +MFac or smaller than the frequency threshold value −MFac.

The switch SW1 is coupled between the sigma delta modulator 242 and the integrator 244. The switch SW1 is configured to receive a switching signal N2. The switch SW1 is turned on or turned off according to the switching signal N2. When the switch SW1 is turned on, the switch SW1 is configured to transmit the modulation signal AF1 to the integrator 244. The integrator 244 is configured to accumulate the modulation signal AF1 to generate an integral signal AF2. The counter 246 is electrically coupled to the integrator 244 to receive the integral signal AF2. The counter 246 is configured to count up and/or down according to the integral signal AF2 to generate a counted signal AF3. In some embodiments, a counting sequence of the counter 246 is controlled by the integral signal AF2. In other words, when the accumulated value AFac is larger than the frequency threshold value MFac, the sigma delta modulator 242 switches the value of the modulation signal AF1, such that the counter 246 starts counting. The multiplier 248 is electrically coupled to the counter 246 to receive the counted signal AF3. The multiplier 248 is configured to multiply the counted signal AF3 and the switching signal N1, in order to generate the control signal C2.

In some embodiments, the frequency filter circuit 240 is operated in one of an adaptation mode and a convergence mode according to the switching signals N1 and N2. In some embodiments, in the adaptation mode, the switching element SW1 is turned on by the switching signal N2, in order to transmit the modulation signal AF1 to the integrator 244. Under this condition, the counter 246 counts up and/or down based on the integral signal AF2 to generate the counted signal AF3. In addition, in the adaptation mode, the logic value of the switching signal N1 is substantially equal to 0. Thus, the control signal C2 outputted from the multiplier 248 is substantially equal to 0. Effectively, in the adaptation mode, the counted signal AF3 does not affect the value of the control signal C2.

In some embodiments, in the convergence mode, the switching element SW1 is turned off by the switching signal N2. As a result, the integrator 244 stops receiving the modulation signal AF1. Under this condition, the counter 246 finishes counting, and the value of the counted signal AF3 is fixed. In addition, in the convergence mode, the logic value of the switching signal N1 is controlled to be switched between 1 and 0 in a predetermined period. As described above, in some embodiments, the input data DATA is processed with the SSC, and the predetermined period of the switching signal N1 is thus associated with the period of the SSC. When the logic value of the switching signal N1 is 1, the multiplier 248 outputs the counted signal AF3 as the control signal C2. When the logic value of the switching signal N1 is 0, the multiplier 248 outputs a signal having the logic value of 0 as the control signal C2. Since the switching signal N1 is switched between 1 and 0 in the predetermined period, the control signal C2 hence has a period that is the same as the predetermined period of the switching N1. In other words, the counted signal AF3 is repeated to be outputted, by the multiplier 248, as the control signal C2 with the predetermined period.

In some embodiments, the above-mentioned logic value of 1 corresponds to a first voltage level, and the above-mentioned logic value of 0 corresponds to a second voltage level. In some embodiments, the first voltage level is different from the second voltage level. In some further embodiments, the first voltage level is higher than the second voltage level.

The configurations of the frequency filter circuit 240 are given for illustrative purposes only. Various configurations of the frequency filter circuit 240 are within the contemplated scope of the present disclosure.

As described above, the period of the control signal C2 is corresponding to the period of the dynamic frequency offsets (for example, SSC offsets) of the input data DATA. Thus, with the arrangements of the phase filter circuit 240, the dynamic frequency offsets of the input data DATA are able to be tracked.

The adder 260 is configured to generate the adjust signal VA according to the control signal C1 and the control signal C2. In detail, the adder 260 adds the control signal C1 and the control signal C2, to generate the adjust signal VA. The adjust signal VA is received by the phase adjust circuit 160 in FIG. 1. The phase adjust circuit 160 adjusts the clock signal CLK1 and the clock signal CLK2 according to the adjust signal VA. Thus, the clock and data recovery device 100 is able to dynamically adjust the clock signal CLK1 and the clock signal CLK2 according to the control signal C1 and the control signal C2.

As described above, the control signal C1 is corresponding to the phase offsets of the input date DATA, and the control signal C2 is corresponding to the dynamic frequency offsets (for example, SSC offsets) of the input data DATA. Thus, in some embodiments, the clock and data recovery device 100 is able to reduce the phase offsets and the dynamic frequency offsets (for example, SSC offsets) of the input data DATA according to the control signal C1 and the control signal C2.

In some embodiments, the clock and data recovery device 100 is implemented with all-digital circuits. In this example, the clock and data recovery device 100 is able to have advantages of scalability and robustness.

Figure 3:
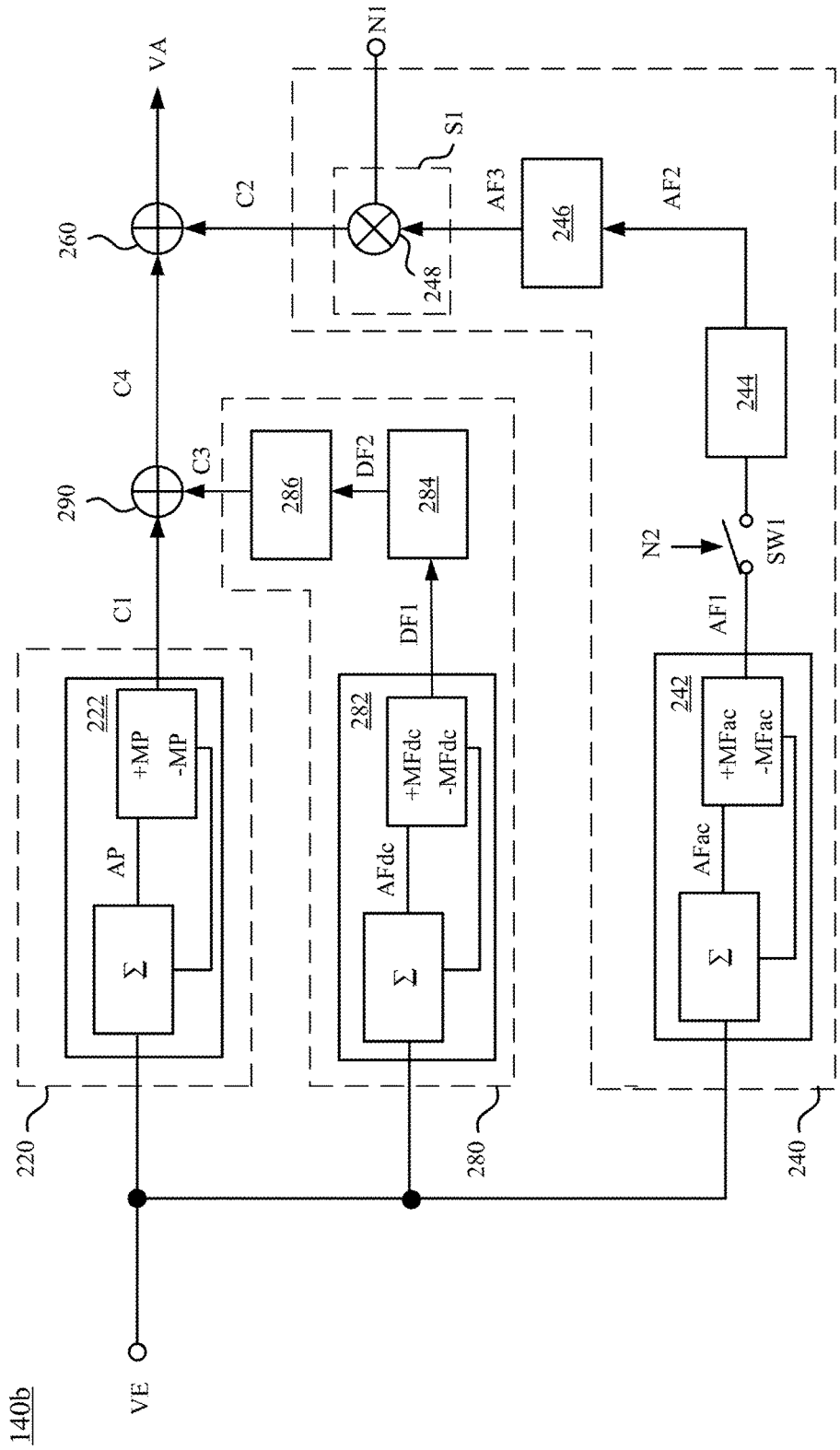
FIG. 3 is a circuit diagram illustrating a loop filter circuit in FIG. 1 according to some embodiments of this disclosure.

Reference is now made to FIG. 3. FIG. 3 is a circuit diagram illustrating a loop filter circuit 140b according to some embodiments of this disclosure. In some embodiments, the loop filter circuit 140b in FIG. 3 is configured to implement the loop filter circuit 140 in FIG. 1. For ease of understanding, with respect to the embodiments of FIG. 1 and FIG. 2, like elements in FIG. 3 are designated with the same reference numbers.

As illustratively shown in FIG. 3, the loop filter circuit 140b includes the phase filter circuit 220, the frequency filter circuit 240, the adder 260, a frequency filter circuit 280, and an adder 290. Explained in another way, with respect to the loop filter circuit 140a in FIG. 2, the loop filter circuit 140b in FIG. 3 further includes the frequency filter circuit 280 and the adder 290.

The frequency filter circuit 280 is configured to receive the error signal VE from the data analysis circuit 120 in FIG. 1, and to generate a control signal C3 according to the error signal VE.

In some embodiments, the frequency filter circuit 280 includes a sigma delta modulator 282, an integrator 284, and a counter 286. The sigma delta modulator 282 is electrically coupled to the data analysis circuit 120 in FIG. 1, to receive the error signal VE. In some embodiments, the sigma delta modulator 282 includes an accumulator. The accumulator of the sigma delta modulator 282 is configured to accumulate the error signal VE to generate an accumulated value AFdc in the frequency path. The sigma delta modulator 282 is further configured to compare the accumulated value AFdc with a frequency threshold value +MFdc or −MFdc. In some embodiments, the sigma delta modulator 282 compares the accumulated value AFdc with the frequency threshold values +MFdc and −MFdc. When the accumulated value AFdc is larger than the frequency threshold value +MFdc, the sigma delta modulator 282 outputs a modulation signal DF1 with the logic value of +1. The accumulator is then reset by subtracting the frequency threshold value +MFdc. When the accumulated value AFdc is smaller than the frequency threshold value −MFdc, the sigma delta modulator 282 outputs the modulation signal DF1 with the logic value of −1. The accumulator is then reset by subtracting the frequency threshold value −MFdc. In other words, the sigma delta modulator 282 updates the modulation signal DF1 on condition that the accumulated value AFdc is larger than the frequency threshold value +MFdc or smaller than the frequency threshold value −MFdc.

The integrator 284 is electrically coupled to the sigma delta modulator 282. The integrator 284 is configured to accumulate the modulation signal DF1 to generate an integral signal DF2. The counter 286 is electrically coupled to the integrator 284. The counter 286 is configured to count up and/or down the integral signal DF2 to generate the control signal C3. In some embodiments, when the accumulated value AFdc is larger than the frequency threshold value MFdc, the sigma delta modulator 282 switches the value of the modulation signal DF1, such that the counter 286 starts counting, to generate the control signal C3.

The configurations of the frequency filter circuit 280 are given for illustrative purposes only. Various configurations of the frequency filter circuit 280 are within the contemplated scope of the present disclosure.

In some embodiments, the frequency filter circuit 280 is configured to track a DC frequency offsets of the input data DATA, and the frequency filter circuit 240 is configured to track the dynamic frequency offsets (for example, SSC offsets) of the input data DATA. Accordingly, in some embodiments, the frequency threshold value MFac is set to be smaller than the frequency threshold value MFdc. For example, the frequency threshold value MFdc is substantially 1000 times of the frequency threshold value MFac. The values of the frequency threshold values MFac and MFdc are given for illustrative purposes only. Various values of the frequency threshold values are within the contemplated scope of the present disclosure.

Based on a setting of the frequency threshold value MFdc, the control signal C3 generated from the frequency filter circuit 280 is corresponding to DC frequency offsets of the input data DATA. Thus, with the arrangements of the frequency filter circuit 280, the DC frequency offsets of the input data DATA are able to be tracked.

In some embodiments, the phase threshold value MP, the frequency threshold value MFdc, and the frequency threshold value MFac are able to be adjusted dynamically by an external program or a circuit, to adjust the bandwidth of the loop filter circuit 140b. In some embodiments, the phase threshold value MP, the frequency threshold value MFdc, and the frequency threshold value MFac are adjusted to be different from each other.

The adder 290 is configured to generate the control signal C4 according to the control signal C1 and the control signal C3. In detail, the adder 290 adds the control signal C1 and the control signal C3, to generate the control signal C4. As described above, the control signal C1 is corresponding to the phase offsets of the input data DATA and the control signal C3 is corresponding to the DC frequency offsets of the input data DATA, the control signal C4 is hence corresponding to the phase offsets and the DC frequency offsets of the input data DATA.

The adder 260 is configured to add the control signal C4 and the control signal C2, to generate the adjust signal VA. The adjust signal VA is received by the phase adjust circuit 160 in FIG. 1. The phase adjust circuit 160 adjusts the clock signal CLK1 and the clock signal CLK2 according to the adjust signal VA.

As described above, the control signal C4 is corresponding to the phase offsets and the DC frequency offsets of the input data DATA, and the control signal C2 is corresponding to the dynamic frequency offsets (for example, SSC offsets) of the input data DATA. Thus, in some embodiments, the clock and data recovery device 100 is able to reduce the phase offsets, the DC frequency offsets, and the dynamic frequency offsets (for example, SSC offsets) of the input data DATA according to the control signal C4 and the control signal C2.

Figure 4:
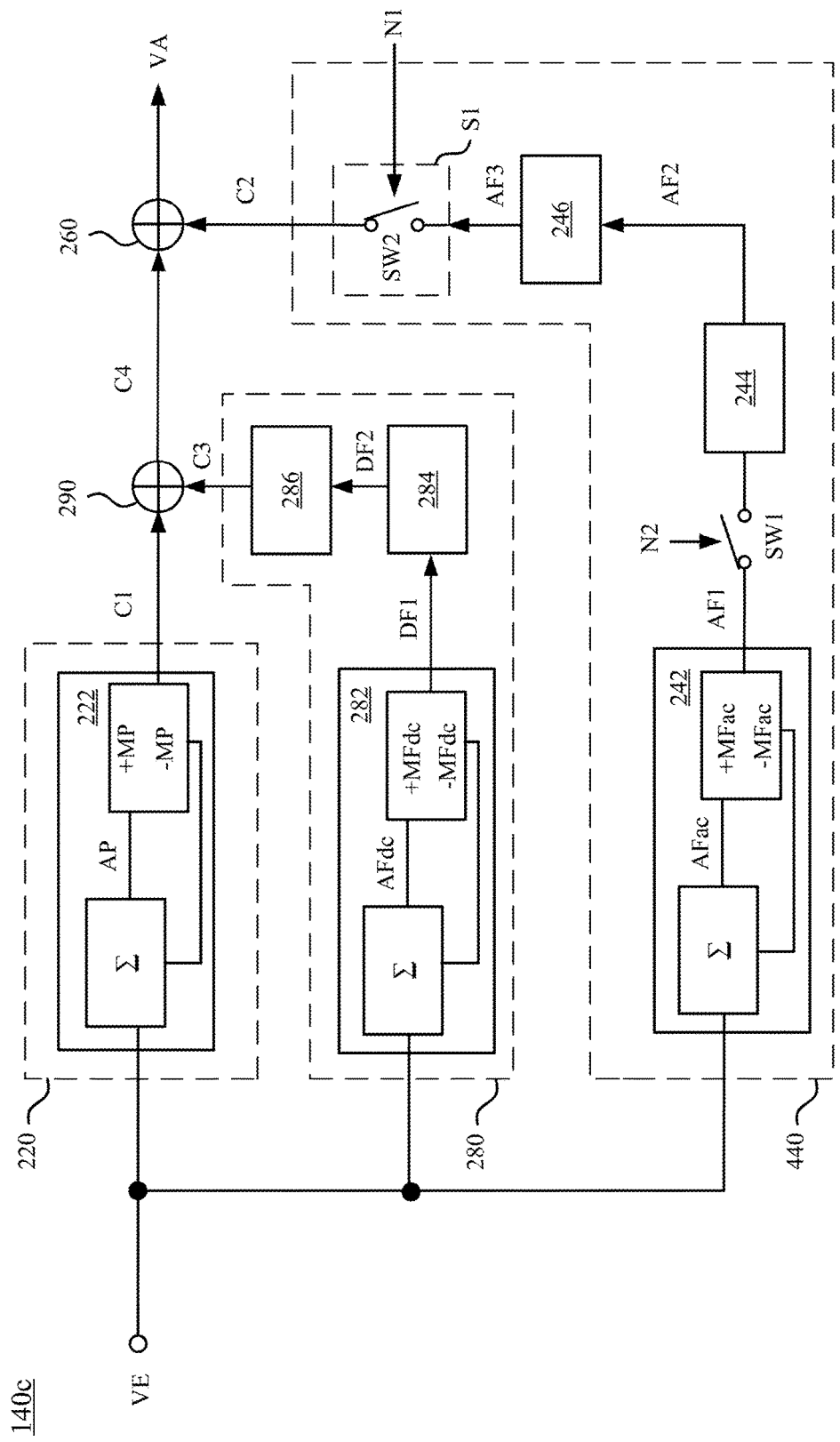
FIG. 4 is a circuit diagram illustrating a loop filter circuit in FIG. 1 according to some embodiments of this disclosure.

Reference is now made to FIG. 4. FIG. 4 is a circuit diagram illustrating a loop filter circuit 140c according to some embodiments of this disclosure. In some embodiments, the loop filter circuit 140c in FIG. 4 is configured to implement the loop filter circuit 140 in FIG. 1. For ease of understanding, with respect to the embodiments of FIG. 1 and FIG. 3, like elements in FIG. 4 are designated with the same reference numbers.

The differences between a frequency filter circuit 440 in FIG. 4 and the frequency filter circuit 240 in FIG. 3 is that the switching element S1 in FIG. 4 is implemented with a switch SW2.

In some embodiments, the switch SW2 is implemented with one or more transistors. Various types of the transistors, which are able to implement the switch SW2, are within the contemplated scope of the present disclosure. In some embodiments, the transistors may be BJTs, MOSFETs, or IGBTs.

The switch SW2 is electrically coupled to the counter 246 and the adder 260. The switch SW2 is configured to receive the switching signal N1. The switch SW2 is turned on or turned off according to the switching signal N1. When the switch SW2 is turned on, the switch SW2 is configured to transmit the counted signal AF3 to generate the control signal C2 to the adder 260. In other word, the counted signal AF3 is transmitted through the switch SW2 to be the control signal C2.

In some embodiments, the switch SW2, in the adaption mode, is turned off according to the switching signal N1. In some embodiments, the switching signal N1, in the convergence mode, switches between the logic value of 0 and the logic value of 1 with the predetermined period. Thus, the switch SW2, in the convergence mode, transmits the counted signal AF3 with the predetermined period to generate the control signal C2.

In some embodiments, the counted signal AF3 in stored in the counter 246, but this disclosure is not limited thereof. Other operations regarding to FIG. 4 are similar to FIGS. 2-3, so are not described herein again.

In addition, the configurations of the frequency filter circuit 440 are given for illustrative purposes only. Various configurations of the frequency filter circuit 440 are within the contemplated scope of the present disclosure.

Figure 5:
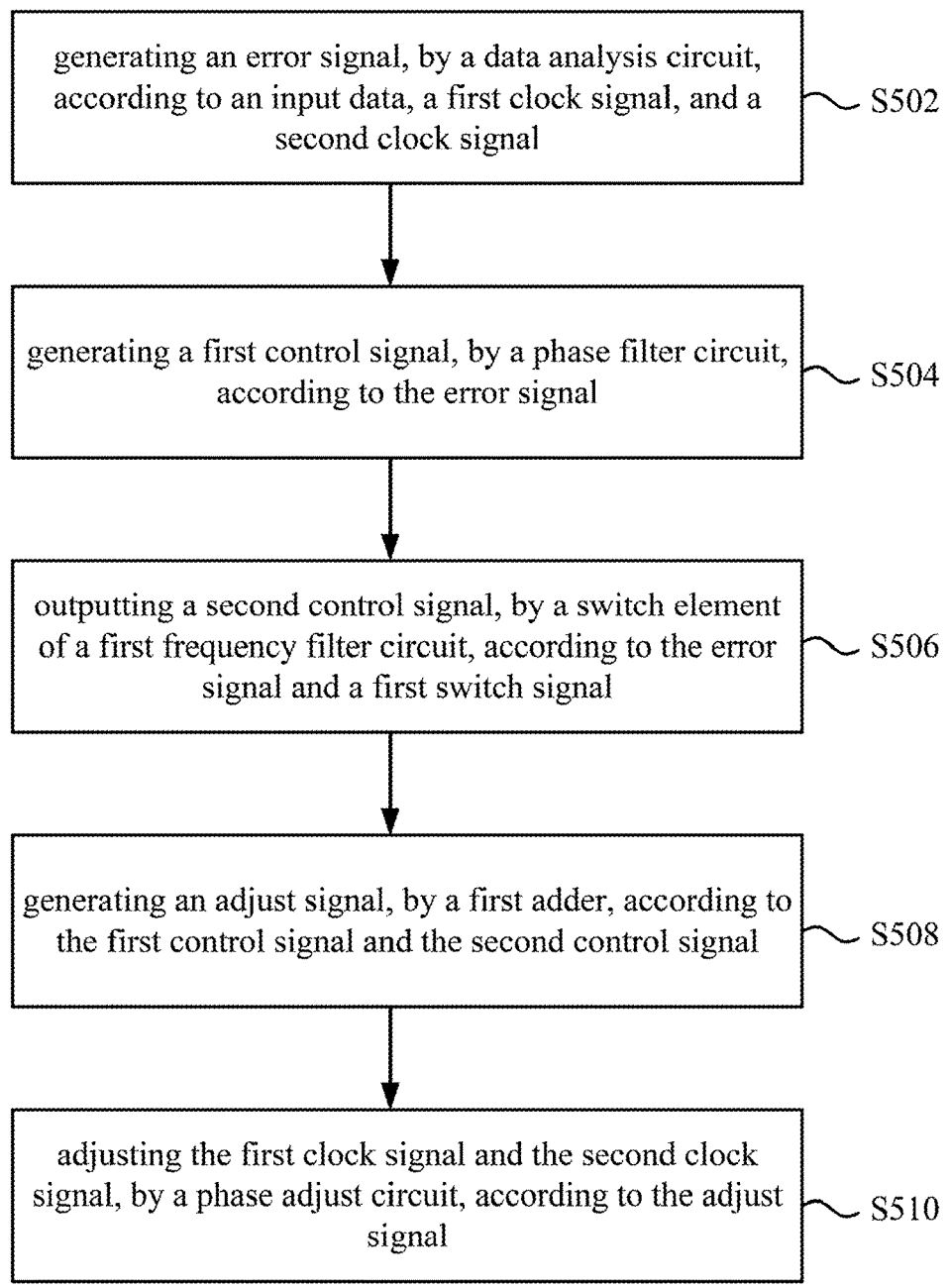
FIG. 5 is a flow diagram illustrating a clock and data recovery method according to some embodiments of this disclosure.

Reference is now made to FIG. 5. FIG. 5 is a flow diagram illustrating a clock and data recovery method 500 according to some embodiments of this disclosure. In some embodiments, the clock and data recovery method 500 is applied to the clock and data recovery device 100. For better understanding of the present disclosure, the clock and data recovery method 500 is discussed with reference to FIG. 1 and FIG. 2.

In step S502, the data analysis circuit 120 generates the error signal VE according to the input data DATA, the clock signal CLK1, and the clock signal CLK2. In some embodiments, the clock signal CLK1 and the clock signal CLK2 are different in phase by 90 degrees.

In step S504, the phase filter circuit 220 generates the control signal C1 according to the error signal VE. In some embodiments, the sigma delta modulator 222 of the phase filter circuit 220 compares the accumulated value AP with the phase threshold value MP to output the control signal C1.

In step S506, the switching element S1 of the frequency filter circuit 240 outputs the control signal C2 according to the error signal VE and the switching signal N1. In some embodiments, the switching signal N1 has the above-mentioned predetermined period. Thus, in some embodiments, the control signal C2 also has the predetermined period.

In step S508, the adder 260 generates the adjust signal VA according to the control signal C1 and the control signal C2. In some embodiments, the adder 260 adds the control signal C1 and the control signal C2 to generate the adjust signal VA.

In step S510, the phase adjust circuit 160 adjusts the clock signal CLK1 and the clock signal CLK2. In some embodiments, the phase adjust circuit 160 is configured to increase or reduce the clock cycles of both of the clock signal CLK1 and the clock signal CLK2.

The above description of the clock and data recovery method 500 includes exemplary operations, but the operations of the clock and data recovery method 500 are not necessarily performed in the order described. The order of the operations of the clock and data recovery method 500 disclosed in the present disclosure are able to be changed, or the operations are able to be executed simultaneously or partially simultaneously as appropriate, in accordance with the spirit and scope of various embodiments of the present disclosure.

As the above embodiments, the clock and data recovery device and the clock and data recovery method of this disclosure reduce dynamic frequency offsets (for example, SSC offsets) of data, so as to reduce jitters of signals.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A clock and data recovery device, comprising:
   a data analysis circuit configured to generate an error signal according to an input data, a first clock signal, and a second clock signal, wherein the input data is processed with a spread spectrum clock;
   a loop filter circuit comprises:
      a phase filter circuit configured to generate a first control signal according to the error signal;
      a first frequency filter circuit configured to generate a second control signal according to the error signal; and
      a first adder configured to generate an adjust signal according to the first control signal and the second control signal,
      wherein the first frequency filter circuit comprises:
         a first sigma delta modulator configured to receive the error signal and output a first modulation signal;
         a first integrator configured to receive the first modulation signal to generate a first integral signal;
         a first counter configured to count the first integral signal to generate a first counted signal; and
         a switching element configured to transmit the first counted signal into the first adder alternatively by a first switching signal with a period corresponding to a period of the spread spectrum clock, for forming the second control signal; and
   a phase adjust circuit configured to adjust the first clock signal and the second clock signal according to the adjust signal.

2. The clock and data recovery device of claim 1, wherein the switching element comprises a multiplier or a first switch.

3. The clock and data recovery device of claim 2, wherein on condition that the switching element comprises the multiplier, the multiplier is configured to multiply the first counted signal and the first switching signal, so as to generate the second control signal.

4. The clock and data recovery device of claim 2, wherein on condition that the switching element comprises the first switch, the first switch is configured to be turned on according to the first switching signal to transmit the first counted signal, so as to generate the second control signal.

5. The clock and data recovery device of claim 1, wherein the first frequency filter circuit comprises:
   a second switch configured to be turned on according to a second switching signal, so as to transmit the first modulation signal to the first integrator.

6. The clock and data recovery device of claim 5, wherein the second switch, in a first mode, is turned on according to the second switching signal, and the second switch, in a second mode, is turned off according to the second switching signal.

7. The clock and data recovery device of claim 1, further comprising:
   a second frequency filter circuit configured to generate a third control signal according to the error signal; and
   a second adder configured to generate a fourth control signal according to the first control signal and the third control signal,
   wherein the first adder is further configured to generate the adjust signal according to the fourth control signal and the second control signal.

8. The clock and data recovery device of claim 7, wherein the second frequency filter circuit comprises:
  a second sigma delta modulator configured to accumulate the error signal to generate a second accumulated value, and to output a second modulation signal according to the second accumulated value and a second frequency threshold value;
  a second integrator configured to accumulate the second modulation signal to generate a second integral signal; and
  a second counter configured to count the second integral signal to generate the third control signal.

9. The clock and data recovery device of claim 8, wherein the second frequency threshold value is different from the first frequency threshold value.

10. The clock and data recovery device of claim 8, wherein the second frequency threshold value is larger than the first frequency threshold value.

11. The clock and data recovery device of claim 10, wherein the second frequency threshold value is substantially 1000 times of the first frequency threshold value.

12. The clock and data recovery device of claim 1, wherein the first switching signal is a first voltage level on a condition that the first frequency filter circuit operates in a first mode, the first switching signal is switched between the first voltage level and a second voltage level on a condition that the first frequency filter circuit operates in a second mode, and the first voltage level is different from the second voltage level.

13. A clock and data recovery method, comprising:
  generating an error signal, by a data analysis circuit, according to an input data, a first clock signal, and a second clock signal, wherein the input data is processed with a spread spectrum clock;
  generating a first control signal, by a phase filter circuit, according to the error signal;
  accumulating the error signal, by a first sigma delta modulator of a first frequency filter circuit, to generate a first accumulated value, wherein the first frequency filter circuit further comprises a first integrator, a first counter, and a switching element;
  outputting a first modulation signal, by the first sigma delta modulator, according to the first accumulated value and a first frequency threshold value;
  accumulating the first modulation signal, by the first integrator, to generate a first integral signal;
  counting the first integral signal, by the first counter, to generate a first counted signal;
  utilizing the switching element to transmit the first counted signal into a first adder alternatively by a first switching signal with a period corresponding to a period of the spread spectrum clock, for forming a second control signal;
  generating an adjust signal, by the first adder, according to the first control signal and the second control signal; and
  adjusting the first clock signal and the second clock signal, by a phase adjust circuit, according to the adjust signal.

14. The clock and data recovery method of claim 13, wherein utilizing the switching element to transmit the first counted signal into the first adder alternatively by the first switching signal comprises:
  multiplying the first counted signal and the first switching signal, by the switching element, so as to generate the second control signal,
  wherein the switching element comprises a multiplier.

15. The clock and data recovery method of claim 13, wherein
  the switching element comprises a first switch.

16. The clock and data recovery method of claim 13, further comprising:
  generating a third control signal, by a second frequency filter circuit, according to the error signal;
  generating a fourth control signal, by a second adder, according to the first control signal and the third control signal; and
  generating the adjust signal, by the first adder, according to the fourth control signal and the second control signal.

17. The clock and data recovery method of claim 16, wherein generating the third control signal by the second frequency filter circuit comprises:
  accumulating the error signal, by a second sigma delta modulator, to generate a second accumulated value;
  outputting a second modulation signal, by the second sigma delta modulator, according to the second accumulated value and a second frequency threshold value;
  accumulating the second modulation signal, by a second integrator, to generate a second integral signal; and
  counting the second integral signal, by a second counter, to generate the third control signal.

18. The clock and data recovery method of claim 17, wherein the second frequency threshold value is larger than the first frequency threshold value.

19. The clock and data recovery method of claim 13, further comprising:
  in a first mode, maintaining the first switching signal as a first voltage level; and
  in a second mode, switching the first switching signal between the first voltage level and a second voltage level,
  wherein the first voltage level is different from the second voltage level.

* * * * *